United States Patent
Racz et al.

(10) Patent No.: US 8,963,537 B2
(45) Date of Patent: Feb. 24, 2015

(54) DEVICE FOR MEASURING A CURRENT FLOWING THROUGH AN ELECTRIC CABLE

(75) Inventors: Robert Racz, Zug (CH); Peter Krummenacher, Basel (CH)

(73) Assignee: Melexis Technologies NV, Tessenderlo (BE)

(*) Notice: Subject to any disclaimer, the term of this patent is extended or adjusted under 35 U.S.C. 154(b) by 247 days.

(21) Appl. No.: 13/483,271

(22) Filed: May 30, 2012

(65) Prior Publication Data

US 2012/0306486 A1 Dec. 6, 2012

(30) Foreign Application Priority Data

May 30, 2011 (CH) .......................................... 918/11
Aug. 26, 2011 (CH) ....................................... 1394/11

(51) Int. Cl.
*G01R 33/06* (2006.01)
*G01R 15/20* (2006.01)

(52) U.S. Cl.
CPC ...................................... *G01R 15/20* (2013.01)
USPC ...................................... 324/117 H; 324/126

(58) Field of Classification Search
CPC ....................................................... G01R 15/20
USPC ...................................................... 324/117 H
See application file for complete search history.

(56) References Cited

U.S. PATENT DOCUMENTS

| | | | |
|---|---|---|---|
| 3,199,026 A * | 8/1965 | Leibowitz | 324/127 |
| 4,717,872 A | 1/1988 | Wagner et al. | |
| 4,791,361 A * | 12/1988 | Beihoff et al. | 324/126 |
| 5,041,761 A * | 8/1991 | Wright et al. | 315/129 |
| 5,055,771 A * | 10/1991 | Gamble et al. | 324/117 R |
| 5,097,202 A * | 3/1992 | Gamble | 324/127 |
| 5,349,289 A * | 9/1994 | Shirai | 324/127 |
| 5,942,895 A | 8/1999 | Popovic et al. | |
| 6,184,679 B1 | 2/2001 | Popovic et al. | |
| 6,426,617 B1 | 7/2002 | Haensgen et al. | |
| 6,545,456 B1 | 4/2003 | Radosevich et al. | |
| 7,545,136 B2 * | 6/2009 | Racz et al. | 324/117 H |
| 7,969,140 B2 * | 6/2011 | Teppan | 324/127 |

(Continued)

FOREIGN PATENT DOCUMENTS

CH 696859 A5 12/2007
CH 698504 B1 8/2009

(Continued)

OTHER PUBLICATIONS

European Search Report for EP 12 16 7772 dated Jun. 10, 2013.

*Primary Examiner* — Jay Patidar
(74) *Attorney, Agent, or Firm* — McCormick, Paulding & Huber LLP

(57) ABSTRACT

A device for measuring a current flowing through an electric cable comprises a printed circuit board, a magnetic field sensor and a ferromagnetic component. The ferromagnetic component comprises two tongues whose front faces are disposed opposite of each other and are separated by an air gap and further comprises at least two feet, with the tongues and/or the feet being bent off. The cable is guidable through an opening which is enclosed by the ferromagnetic component. The ferromagnetic component and the magnetic field sensor are mounted on a surface of the printed circuit board. The magnetic field sensor is sensitive to a magnetic field extending parallel to the surface of the printed circuit board. The tongues of the ferromagnetic component extend parallel to the surface of the printed circuit board (2).

14 Claims, 8 Drawing Sheets

(56) References Cited

U.S. PATENT DOCUMENTS

Figure 1:
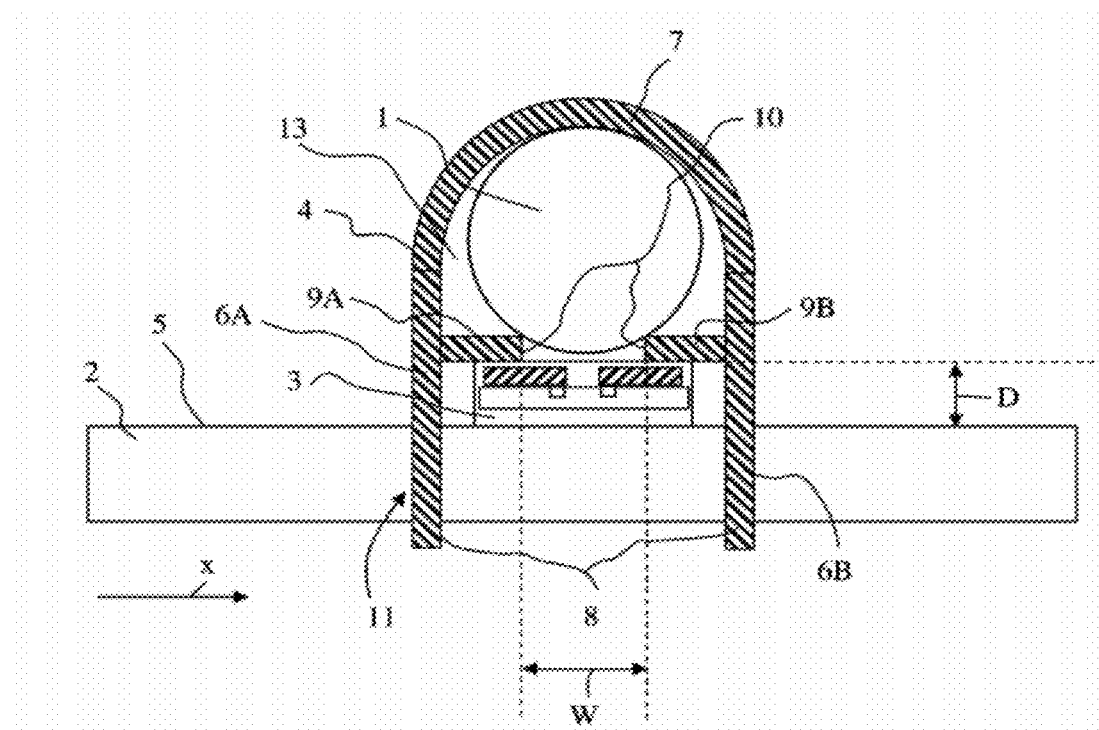

| | | | |
|---|---|---|---|
| 8,203,328 B2 * | 6/2012 | Bose et al. | 324/117 H |
| 2003/0227285 A1 | 12/2003 | Marasch et al. | |
| 2006/0232262 A1 | 10/2006 | Tanizawa et al. | |
| 2012/0217963 A1 * | 8/2012 | Naka et al. | 324/253 |

FOREIGN PATENT DOCUMENTS

| | | |
|---|---|---|
| DE | 10240241 A1 | 8/2002 |
| EP | 1857823 A2 | 5/2007 |
| JP | 62098267 A | 5/1987 |
| JP | 2003302428 A | 10/2003 |

\* cited by examiner

DEVICE FOR MEASURING A CURRENT FLOWING THROUGH AN ELECTRIC CABLE

PRIORITY CLAIM

Applicant hereby claims foreign priority under 35 U.S.C §119 from Swiss Application No. 918/11 filed May 30, 2011 and Swiss patent application no. 1394/11 filed Aug. 26, 2011, the disclosures of which are herein incorporated by reference.

FIELD OF THE INVENTION

The invention relates to a device for measuring a current flowing through an electric cable, i.e. a current sensor, with a magnetic field sensor measuring the strength of the magnetic field generated by the current.

BACKGROUND OF THE INVENTION

A large number of current sensors and devices for measuring current are known from the state of the art. U.S. Pat. No. 7,545,136 discloses a device for current measurement which is suitable for the measurement of currents up to typically 100 A that can be loaded temporarily with an overload current of up to 1000 A and is shielded against external magnetic interference fields. CH 696859 and JP 62098267 disclose current sensors in which a first Hall sensor is arranged in the air gap of a yoke made of ferromagnetic material which encloses the current conductor, and a second Hall sensor is arranged outside of the yoke. The yoke and the first Hall sensor are used for measuring relatively small currents; the second Hall sensor is used for measuring relatively large currents. It is disadvantageous in these latter current sensors that the air gap is relatively large with typically 1 to 3 mm, the yoke requires a lot of material, and production and mounting is complex.

SUMMARY OF THE INVENTION

The invention is based on the object of developing a current sensor for the measurement of a current flowing through a cable, which sensors offers effective shielding against external interference fields and can be mounted in a simple manner.

A device for measuring a current flowing through an electric cable according to the invention comprises a printed circuit board, a magnetic field sensor, and a ferromagnetic component. The magnetic field sensor and the ferromagnetic component are mounted on a surface of the printed circuit board. The magnetic field sensor is sensitive to a magnetic field extending parallel to the surface of the printed circuit board. The ferromagnetic component comprises two tongues whose front faces are disposed opposite of each other and are separated by an air gap and further comprises at least two feet, with the tongues and/or the feet being bent off. The tongues of the ferromagnetic component extend parallel to the surface of the printed circuit board and either rest on the magnetic field sensor or are arranged at a distance from the magnetic field sensor above the magnetic field sensor. The cable is guidable through an opening which is enclosed by the ferromagnetic component.

In a first embodiment, the ferromagnetic component is a piece of sheet metal or a laminate of several pieces of sheet metal bent in a U-shaped manner, or consists of ferrite, and comprises a middle part and two legs. The tongues are bent off relative to the legs. The middle part and the tongues enclose the opening for the cable.

In another embodiment, the ferromagnetic component consists of two components, so that the device is mountable on a fixedly mounted cable.

The printed circuit board may comprise slots or boreholes or depressions, into which the feet of the ferromagnetic component are insertable. Alternatively, the ends of the feet of the ferromagnetic component may extend parallel to the surface of the printed circuit board and be glued or soldered to the printed circuit board.

The printed circuit board may comprise slots or boreholes or depressions and the ferromagnetic component may comprise further feet which are insertable into the slots or bores or depressions.

In a further embodiment, the ferromagnetic component is a substantially annular piece of sheet metal or a laminate of several pieces of sheet metal, or consists of ferrite, which encloses the opening for the cable and comprises two mutually opposite ends which are separated by an air gap and form the tongues, wherein the feet are bent off relative to the annular piece of sheet metal.

The magnetic field sensor may comprise a semiconductor chip with at least one integrated Hall element and two magnetic field concentrators which are arranged on the semiconductor chip and are separated by an air gap, wherein the at least one Hall element is arranged in the region of said air gap. The tongues of the ferromagnetic component and the magnetic field concentrators may overlap one another at least in part. The magnetic field sensor may be another type of magnetic field sensor, like a magnetoresistive sensor, for example an AMR or GMR sensor, or a fluxgate sensor.

BRIEF DESCRIPTION OF THE DRAWING FIGURES

Figure 2:
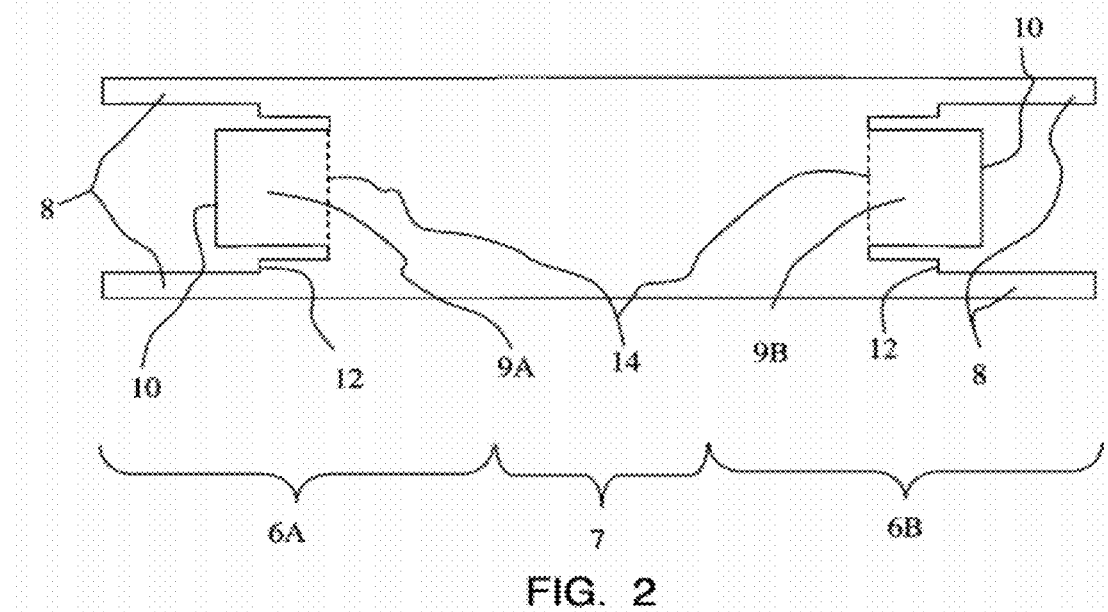
Figure 3:
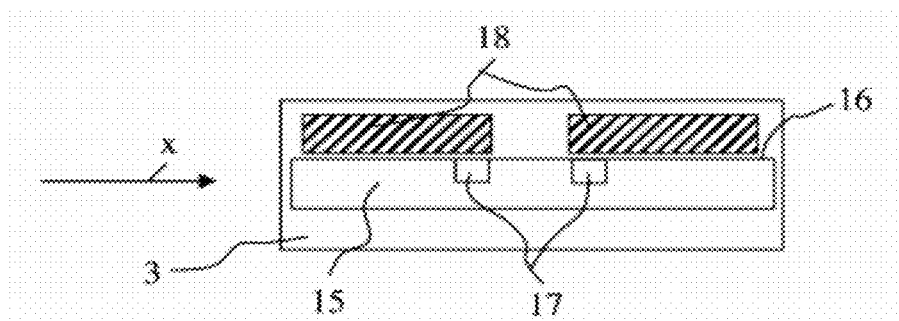
Figure 4:
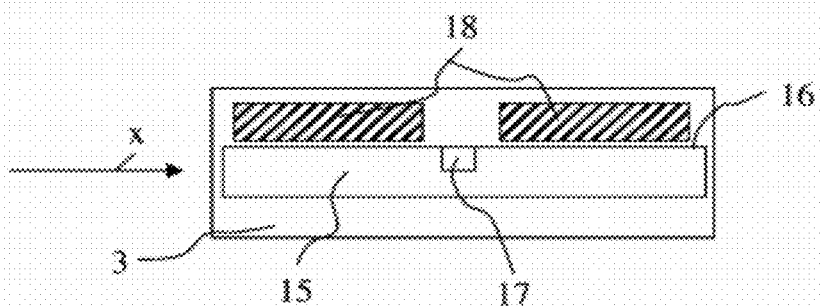
Figure 5:
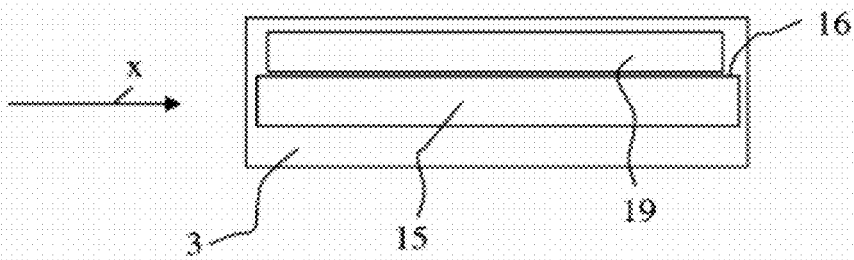
Figure 10:
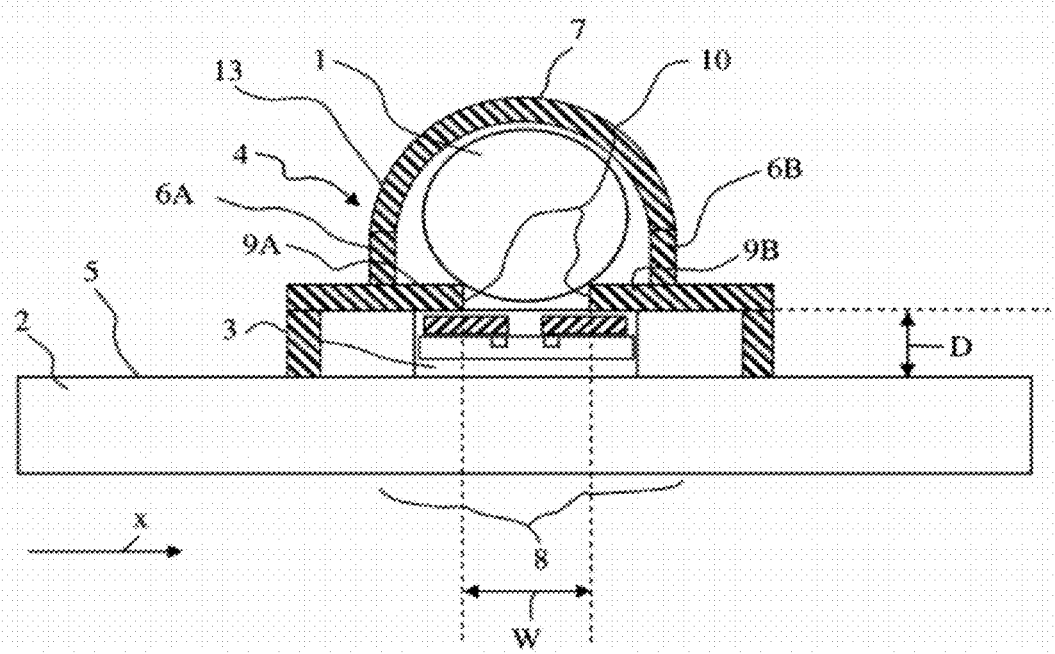
Figure 11:
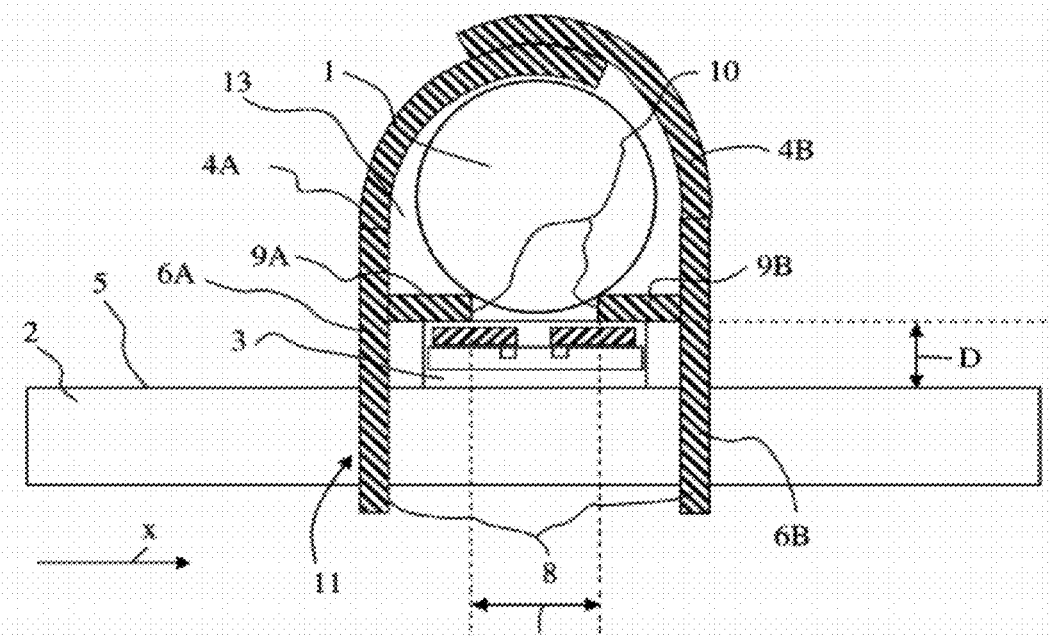
Figure 12:
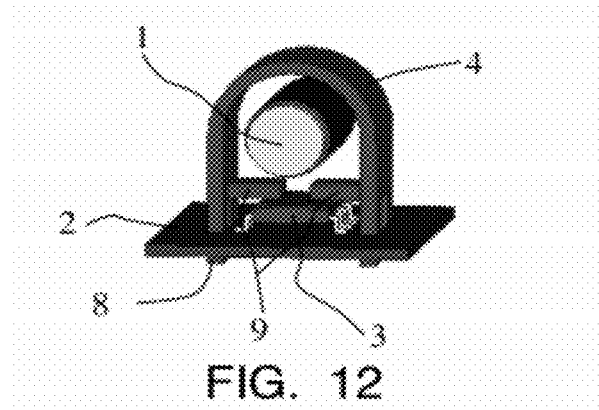
Figure 13:
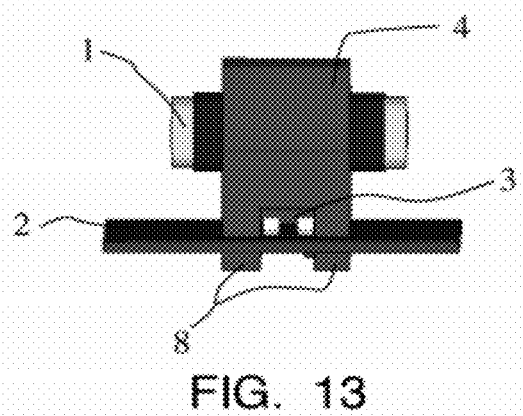
Figure 14:
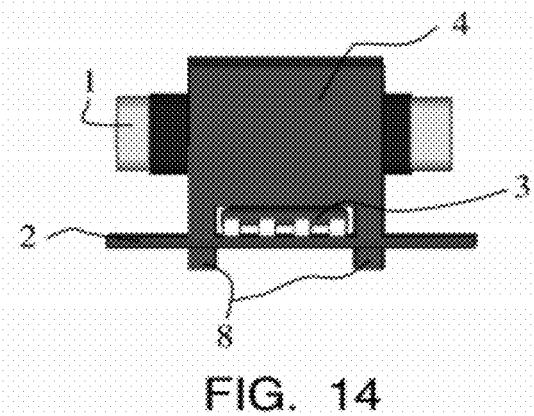
Figure 15:
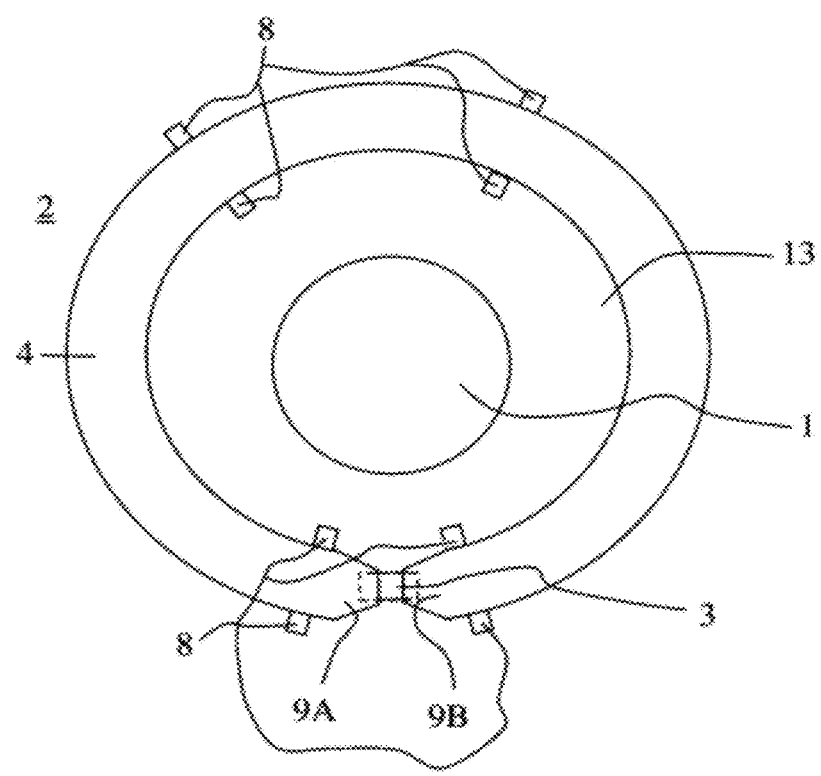
Figure 16:
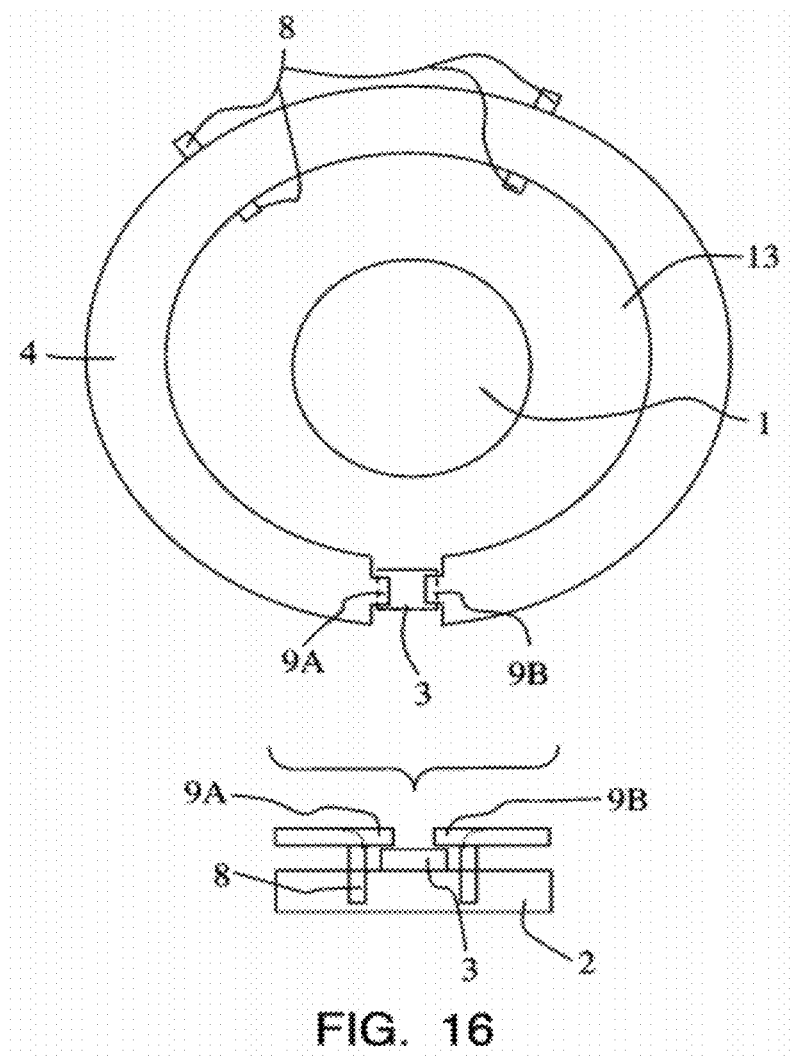

The accompanying drawings, which are incorporated into and constitute a part of this specification, illustrate one or more embodiments of the present invention and, together with the detailed description, serve to explain the principles and implementations of the invention. The figures are not shown true to scale. In the drawings:

FIG. 1 shows a first embodiment of a device in accordance with the invention for measuring a current flowing through an electric cable, FIG. 2 shows a piece of sheet metal which is used as a starting point for a ferromagnetic component, FIGS. 3-5 show magnetic field sensors, FIGS. 6-11 show variants of the first embodiment, FIG. 12 shows the first embodiment in a perspective view, FIGS. 13, 14 show a lateral view of two variants of the embodiment of FIG. 12, FIG. 15 shows a second embodiment of a device in accordance with the invention for measuring a current flowing through an electric cable, and FIG. 16 shows variant of the second embodiment.

DETAILED DESCRIPTION OF THE PREFERRED EMBODIMENTS

FIG. 1 shows a sectional view of a first embodiment of a device in accordance with the invention for measuring a current flowing through an electric cable 1. The cross section of such a cable 1 is typically circular. The device comprises a printed circuit board 2, a magnetic field sensor 3 and a ferromagnetic component 4. The configuration of the magnetic field sensor 3 as shown in this drawing will be explained below in closer detail by reference to FIG. 3. The magnetic field sensor 3 is arranged on a surface 5 of the printed circuit board 2 and is sensitive to a component of the magnetic field which extends parallel to the surface 5 of the printed circuit board 2. The direction of this component is designated in the drawing as X-direction. The ferromagnetic component 4 is made from a piece of sheet metal (also see FIG. 2) which is bent in a U-shaped manner. The term of "sheet metal" shall be understood at all times in such a way that it also comprises a laminate of stacked thin sheets. The component 4 which is bent in a U-shaped manner therefore comprises two straight legs 6A and 6B which converge seamlessly into a middle part 7 which is bent in an approximately semi-spherical manner. The two legs 6A and 6B of the component 4 extend approximately parallel with respect to each other and are formed in such a way that they comprise at least two, preferably four, feet 8 on the one hand and two tongues 9A and 9B on the other hand. The tongues 9A and 9B are bent off in relation to the legs 6 of the "U". The angle between the tongue 9 and the leg 6 is approximately 90°. The two free ends of the tongues 9A and 9B, i.e. their front sides 10, are therefore disposed opposite of one another and are separated from one another by an air gap of width W. The printed circuit board 2 comprises slots 11 or boreholes adjacent to the magnetic field sensor 3, into which the feet 8 of the ferromagnetic component 4 can be inserted. The feet 8 are preferably provided with a stop 12 which during the insertion of the feet 8 into the slots 11 of the printed circuit board 2 comes to lie on the surface 5 of the printed circuit board 2, so that the tongues 9 extend at a defined distance D parallel to the surface 5 of the printed circuit board 2. The distance D is advantageously dimensioned in such a way that the tongues 9 rest on the housing of the magnetic fields into 3 without exerting any excessive pressure on the housing, or are arranged at a small distance from the magnetic field sensor 3. In other words, the distance D corresponds approximately to the height of the housing of the magnetic field sensor 3 when it is mounted on the printed circuit board 2. The middle part 7 and the tongues 9A and 9B of the ferromagnetic component 4 delimit an opening 13 through which the cable 1 is guided.

FIG. 2 shows a top view of the sheet metal, from which the ferromagnetic component 4 is preferably formed before it is bent into the U-shape. The lines 14 designate him bending edges, i.e. the edges around which the tongues 9 are bent in order to bend them in relation to the legs 6 of the "U".

FIG. 3 shows the magnetic field sensor 3 of FIG. 1 in an enlarged illustration. This is a preferred embodiment of the magnetic field sensor 3. The magnetic field sensor 3 comprises a semiconductor chip 15 with at least one sensor element which is integrated in a surface 16 and is sensitive to magnetic field, e.g. a Hall element 17, and an electronic circuit for the operation of the at least one Hall element 17 and two magnetic field concentrators 18 which are arranged on the surface 16 of the semiconductor chip 15 and are separated by an air gap. The magnetic field concentrators 18 are formed by a ferromagnetic layer which was applied to the semiconductor chip 15. The term of Hall element also comprises a cluster of Hall elements. The at least one Hall element 17 is a so-called horizontal Hall element which is sensitive to the component of the magnetic field which extends perpendicularly to the surface 16 of the semiconductor chip 15. Two horizontal Hall elements are provided in the example, which are arranged on either side of the air gap between the magnetic field concentrators 18 in the region of their edge beneath the magnetic field concentrators 18. FIG. 4 shows a further embodiment of the magnetic field sensor 3, in which the at least one Hall element 17 is a vertical Hall element which is sensitive to the component of the magnetic field which extends parallel to the surface of the direction designated as the X-direction. The at least one vertical Hall element 17 is arranged approximately in the middle of the air gap between the magnetic field concentrators 18. The Hall elements 17 are permeated in both cases by field lines of the magnetic field which emerge from a magnetic field concentrator 18 at its bottom side adjacent to the air gap and enter into the other magnetic field concentrator 18 on its bottom side adjacent to the air gap. Other sensors sensitive to magnetic fields can be used instead of Hall elements, especially magnetoresistive sensors such as AMR (=anisotropic magnetoresistive effect) or GMR (=giant magnetoresistive effect) sensors or a fluxgate sensor. An AMR sensor consists for example of four narrow strips of a thin ferromagnetic layer which are switched in form of a Wheatstone bridge. An especially well suitable ferromagnetic material is permalloy. Permalloy is a soft-magnetic nickel-iron alloy of high magnetic permeability. A GMR sensor does not contain one single ferromagnetic layer, but a sequence of layers of alternating ferromagnetic and non-magnetic thin layers with a layer thickness of a few nanometers. It is advantageous when the AMR sensor and the GMR sensor or fluxgate sensor extend over the entire width of the air gap to the end regions of the magnetic field concentrators 18, so that it overlaps with their end regions.

FIG. 5 shows a sectional view of a magnetic field sensor 3 with a sensor element 19 which is sensitive to a magnetic field and is a magnetoresistive sensor or fluxgate sensor for example. The length of the tongues 9A, 9B of the ferromagnetic component 4 and the width of the magnetic field sensitive sensor element 19 are advantageously adjusted to one another in such a way that the end regions of the tongues 9A, 9B overlap with the magnetic layers or cores of the sensor element 19.

Figure 6:
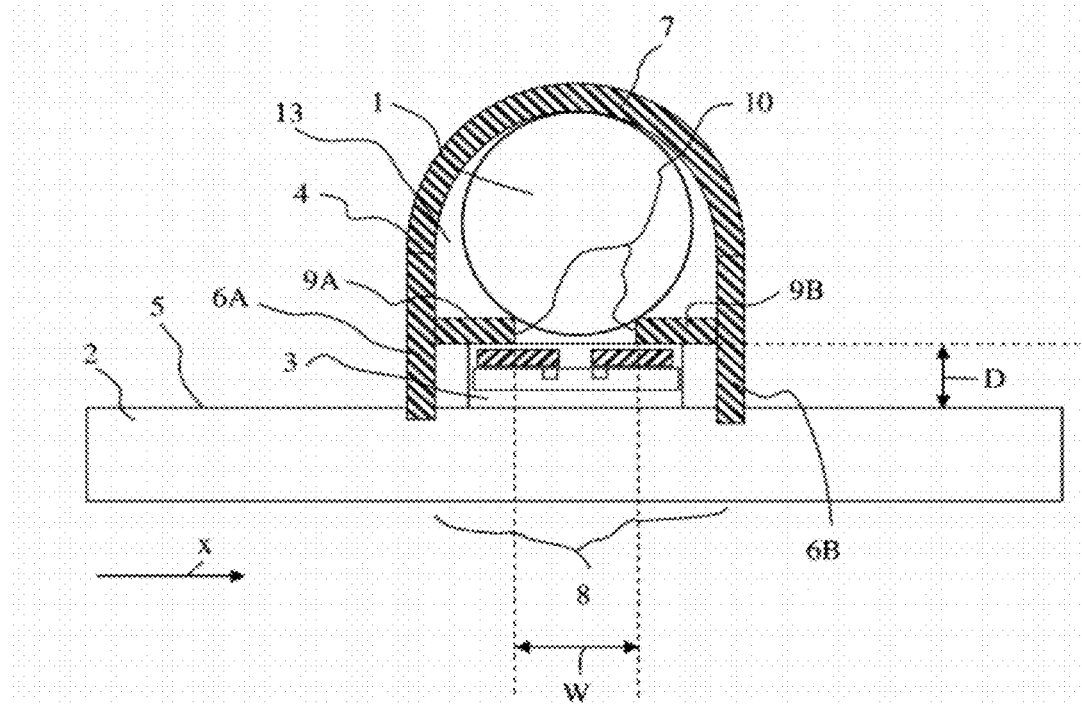
Figure 7:
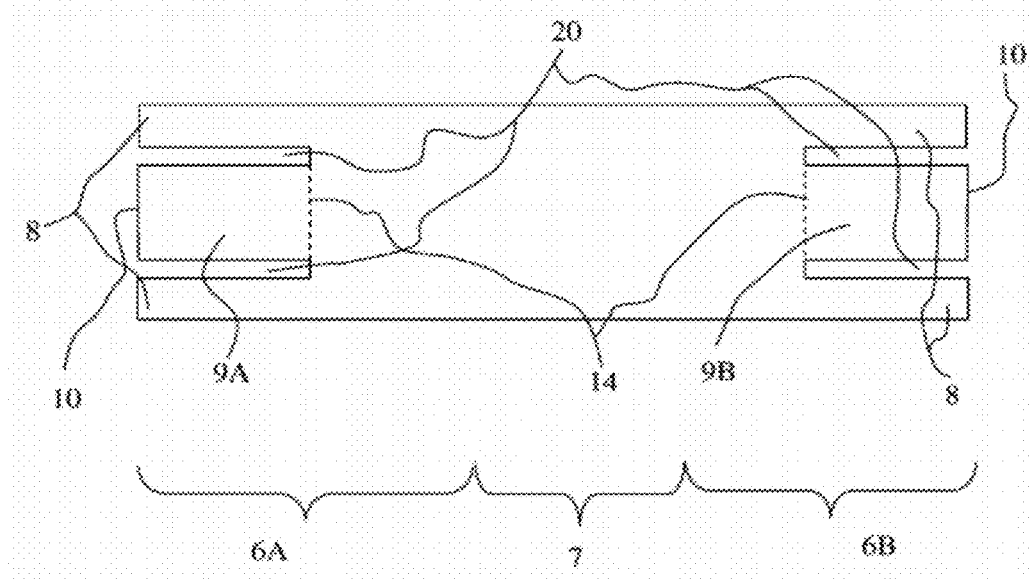
Figure 8:
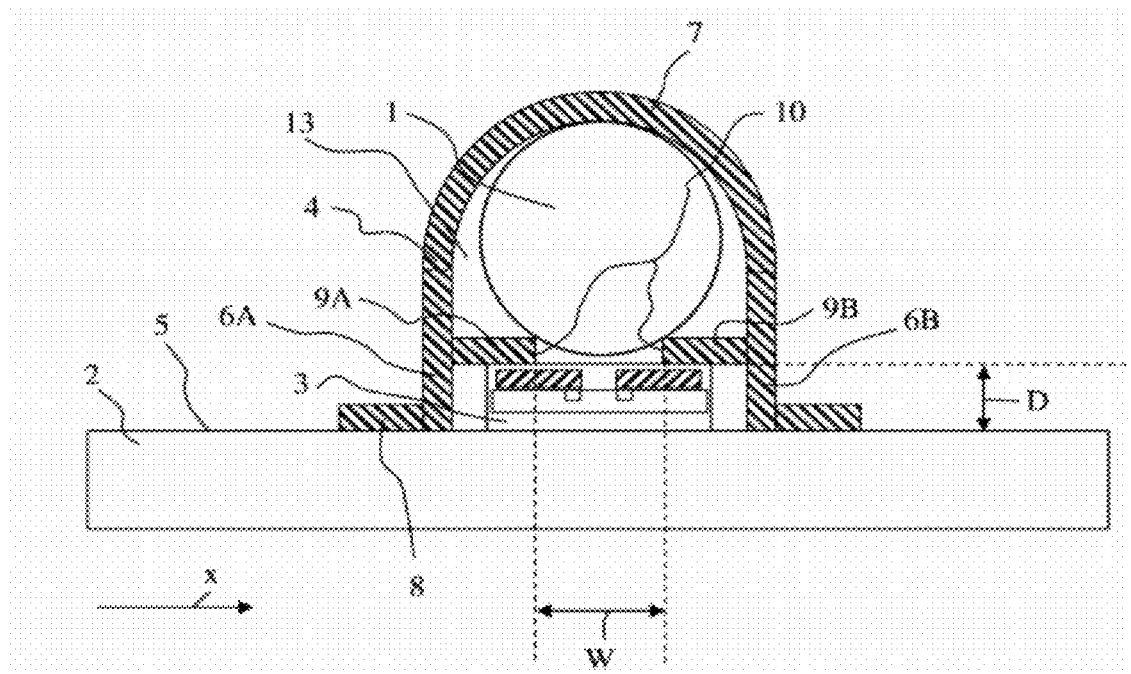
Figure 9:
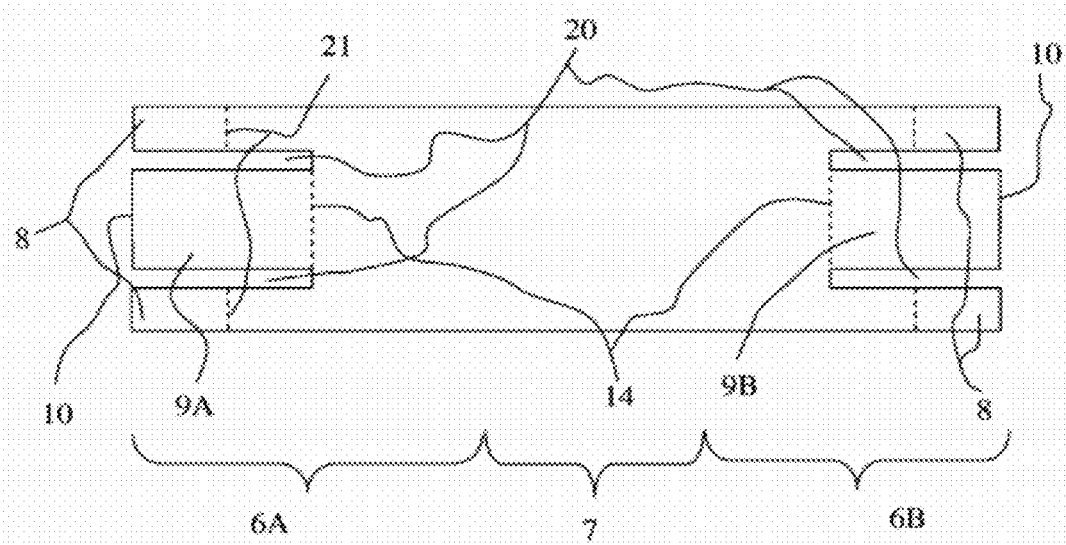

FIGS. 6 to 11 show different variants of the first embodiment which differ from one another substantially by the concrete configuration of the ferromagnetic component 4. In the variant as shown in FIG. 6, the starting point of the ferromagnetic component 4 is a rectangular piece of sheet metal in which—as shown in FIG. 7—the tongues 9 and the feet 8 were formed by punching four parallel slots 20. The feet 8 are either inserted into the continuous slots 20 or non-continuous slots, i.e. depressions or pocket holes, of the printed circuit board 2. In the variant as shown in FIG. 8, the feet 8 of the ferromagnetic component 4 are bent off in relation to the legs 6 of the "U", in this example for about 90°, and the ferromagnetic component 4 is not inserted into the slots of the printed circuit board 2, but is fixed to the surface 5 of the printed circuit board 2, e.g. by glueing or soldering. In this case, the printed circuit board 2 is advantageously provided with positioning elements or positioning markings which are arranged directly adjacent to the magnetic field sensor 3 and which ensure a precise alignment of the ferromagnetic component 4 with respect to the magnetic field sensor 3 during mounting. FIG. 9 shows a top view of the piece of sheet metal which is used as the starting point for the ferromagnetic component 4, with the lines 21 designating further bending edges around which the feet 8 are bent in order to obtain the alignment of the feet 8 which is parallel to the surface 5 of the printed circuit board 2. In the variant as shown in FIG. 10, both the tongues 9 and the feet 8 are bent off in relation to the legs 6 of the "U", but in this case in the reverse direction, and the feet 8 are bent off again so that the shape of the ferromagnetic component 4 is obtained which is shown in FIG. 10 in a sectional view. The first embodiment and the illustrated variants can be combined in any desired manner with one another in order to adapt the shape of the ferromagnetic component 4 in an optimal way to the size and diameter of the cable 1 and to achieve a simple and stable manner of fixing the ferromagnetic component 4 to the printed circuit board 2. FIG. 11 shows a variant in which the ferromagnetic component 4 consists of two components, i.e. a component 4A and a component 4B. The ends of the two components 4A and 4B which form the middle part 7 of the ferromagnetic component 4 overlap one another. They can also mesh with one another. This two-part configuration allows mounting the ferromagnetic component 4 on a cable 1 which has already been tightly wired without having to detach the cable 1 and guiding it through the opening 13 of the ferromagnetic component 4.

In the illustrated embodiments, the ferromagnetic component 4 is made of a piece of sheet metal or a laminate made of sheet metal and is shaped by punching and bending. The ferromagnetic component 4 can also consist of ferrite in all embodiments and be produced by a sintering process.

The ferromagnetic component 4 contains two magnetic circuits, i.e. a first magnetic circuit which substantially encloses the cable 1 and comprises the tongues 9 and a second magnetic circuit which comprises the feet 8, with the middle part 7 and the adjacent parts of the legs 6 belonging to both magnetic circuits. The ferromagnetic component 4 and the magnetic field concentrators 18 form the first magnetic circuit with the air gap, in which the sensor element which is sensitive to the magnetic field (e.g. as described above a Hall element, AMR sensor, GMR sensor, fluxgate sensor) is arranged. The sensitivity of the device with respect to the current flowing through the cable 1 depends on the configuration of this first magnetic circuit, especially the geometry and size of its air gap. The sensitivity of the device can be reduced, either by enlarging the vertical distance between the tongues 9 of the ferromagnetic component 4 and the magnetic field sensor 3 (especially the magnetic field concentrators 18), or in such a way that the tongues 9 of the ferromagnetic component 4 and the magnetic field sensor 3 do not overlap one another, which means optionally that the distance W between the front faces 10 of the tongues 9A and 9B is larger than the entire length of the magnetic field concentrators 18 on the semiconductor chip 15, so that the tongues 9 and the magnetic field concentrators 18 are respectively separated by a lateral air gap. In this manner, the sensitivity of the device can be adjusted to the maximum current to be measured.

External magnetic interference fields enter into the ferromagnetic component 4 at the feet 8 on the one side, are guided through the middle part 7 and exit on the feet 8 at the other side. External magnetic interference fields are therefore guided around the magnetic field sensor 3. The degree of shielding of the ferromagnetic component 4 against external magnetic interference fields can relevantly be controlled by way of the alignment of the ends of the feet 8, i.e. whether they are perpendicular (as shown in FIG. 1 for example) or parallel to the surface 5 of the printed circuit board 2 (as shown in FIG. 8 for example), and their length and also width.

When the feet 8 extend parallel to the surface 5 of the printed circuit board 2 and the ferromagnetic component 4 is glued or soldered to the printed circuit board 2, then it is advantageous to provide the ends of the legs 6 with further feet (not shown) which can be inserted into the slots 11, boreholes or depressions of the printed circuit board 2. (In other words, the ferromagnetic component 4 contains both the bent feet of FIG. 8 and also the feet of FIG. 1). The slots 11 are used as positioning elements which ensure together with the further feet a precise alignment of the ferromagnetic component 4 with respect to the magnetic field sensors 3.

The printed circuit board 2 can be so small that it fits between the feet 8. In this case, the feet 8 are configured in such a way that they can be fastened directly to the edge of the printed circuit board 2. The edge of the printed circuit board 2 can contain recesses for example into which the feet 8 fit. In one embodiment, the feet 8 clamp the printed circuit board 2.

FIG. 12 shows the first embodiment in a perspective view, with the diameter of the cable 1 being reduced for reasons of clarity of the illustration. The size of the ferromagnetic component 4 is advantageously dimensioned in such a way that the middle part 7 and the tongues 9 rest on the cable 1. The magnetic field sensor 3 is packed into a standard housing with laterally protruding feet.

FIG. 13 shows a lateral view of a first variant of this embodiment, in which the feet of the magnetic field sensor 3 fit into the region of the feet 8 of the ferromagnetic component 4. FIG. 14 shows a lateral view of a second variant of this embodiment, in which the ferromagnetic component 4 is narrower than the magnetic field sensor 3 and is therefore formed longer, so that the feet of the magnetic field sensor 3 fit between two feet of the ferromagnetic component 4.

FIG. 15 shows a sectional view of a second embodiment of a device in accordance with the invention for measuring the current flowing through an electric cable 1. In this embodiment, the ferromagnetic component 4 is made of a substantially annular piece of sheet metal which has two mutually opposite ends separated by an air gap, i.e. the ring is not closed. These ends are built as tongues 9A and 9B, with their front faces 10 being opposite of one another and separated by the air gap. The sheet is arranged with feet 8 which are bent off by approximately 90° in relation to the plane opened up by the ring. At least some of the feet 8 are arranged directly close to the tongues 9A and 9B, so that—after the mounting of the ferromagnetic component 4 on the printed circuit board 2—the position of the tongues 9A and 9B with respect to the printed circuit board 2 or the magnetic field sensor 3 is well-defined on the one hand and stable over a long period of time on the other hand. The inside diameter of the opening 13 of the ring corresponds approximately to the diameter of the cable 1. The printed circuit board 2 also has a hole in this embodiment, which forms a lead-through for the cable 1 with the opening 13 enclosed by the annular ferromagnetic component 4.

FIG. 16 shows a variant of the second embodiment in which the feet 8 are arranged directly adjacent to the tongues 9. The bending edges of the feet 8 extend in this case parallel to the front faces of the tongues 9A and 9B. The region of the tongues 9A and 9B is shown beneath the curly bracket in a sectional view.

The device in accordance with the invention offers several advantages:

- The magnetic resistance of the magnetic circuit formed by the ferromagnetic component 4 and the magnetic field sensor 3 is very low because it only has an air gap of approximately 30 µm when using a Hall sensor. When using a magnetoresistive sensor or fluxgate sensor as a magnetic field sensor, the magnetic resistance is even lower because these types of sensors comprise ferromagnetic layers themselves, so that the effective air gap of the magnetic circuit will become even smaller or disappear. This leads to a high sensitivity of the device when required.
- The ferromagnetic component 4 is an efficient analogue amplifier of the magnetic field to be measured on the one hand and an efficient shield against external magnetic interference fields on the other hand.
- The required material is substantially lower than in the state of the art.
- The mounting on a cable is very simple.
- The device is especially suitable for so-called smart grid and smart monitoring applications.

In order to form stable magnetic conditions, the ferromagnetic component 4 needs to be annealed after the sheet metal has been bent into its final shape, especially when it consists of an alloy such as permalloy, and may not be mechanically changed again because otherwise hysteresis effects may occur. Exempt therefrom are the feet 8 however, which may also be processed mechanically after annealing, especially during mounting on the cable 1, because although the feet 8 are a component of the ferromagnetic component 4, they are not involved in its magnetic function of amplifying the magnetic field to be detected.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims and their equivalents.

What is claimed is:

1. A device for measuring a current flowing through an electric cable, comprising:
    a printed circuit board,
    a magnetic field sensor, and
    a ferromagnetic component of sheet metal which is bent in a U-shaped manner and comprises a middle part and two legs,
    wherein
    the magnetic field sensor and the ferromagnetic component are mounted on a surface of the printed circuit board,
    the magnetic field sensor is sensitive to a magnetic field extending parallel to the surface of the printed circuit board,
    the ferromagnetic component comprises two tongues whose front faces are disposed opposite of each other and are separated by an air gap, wherein the tongues are punched out from the legs and bent relative to the legs, so as to
    extend parallel to the surface of the printed circuit board and either rest on the magnetic field sensor or be arranged at a distance from the magnetic field sensor above the magnetic field sensor, and
    wherein the middle part and the tongues of the ferromagnetic component enclose an opening for the cable.

2. The device according to claim 1, wherein the ferromagnetic component consists of two components, so that the device is mountable on a fixedly mounted cable.

3. The device according to claim 2, wherein the legs of the ferromagnetic component are formed to include feet and wherein the printed circuit board comprises slots or boreholes or depressions, into which the feet are insertable.

4. The device according to claim 2, wherein the legs of the ferromagnetic component are formed to include feet that are bent at an angle in relation to the legs so that the feet extend parallel to the surface of the printed circuit board and wherein the feet are glued or soldered to the printed circuit board.

5. The device according to claim 4, wherein the ferromagnetic component comprises further feet which are insertable into slots or bores or depressions of the printed circuit board.

6. The device according to claim 2, wherein the magnetic field sensor comprises a semiconductor chip with at least one integrated Hall element and two magnetic field concentrators which are arranged on the semiconductor chip and are separated by an air gap, and wherein the at least one Hall element is arranged in the region of said air gap.

7. The device according to claim 6, wherein the tongues of the ferromagnetic component and the magnetic field concentrators overlap one another at least in part.

8. The device according to claim 2, wherein the magnetic field sensor comprises a magnetoresistive sensor or a fluxgate sensor.

9. The device according to claim 1, wherein the legs of the ferromagnetic component are formed to include feet, and wherein the printed circuit board comprises slots or boreholes or depressions, into which the feet are insertable.

10. The device according to claim 1, wherein the legs of the ferromagnetic component are formed to include feet that are bent at an angle in relation to the legs so that extend parallel to the surface of the printed circuit board and wherein the feet are glued or soldered to the printed circuit board.

11. The device according to claim 10, wherein the ferromagnetic component comprises further feet which are insertable into slots or bores or depressions of the printed circuit board.

12. The device according to claim 1, wherein the magnetic field sensor comprises a semiconductor chip with at least one integrated Hall element and two magnetic field concentrators which are arranged on the semiconductor chip and are separated by an air gap, and wherein the at least one Hall element is arranged in the region of said air gap.

13. The device according to claim 12, wherein the tongues of the ferromagnetic component and the magnetic field concentrators overlap one another at least in part.

14. The device according to claim 1, wherein the magnetic field sensor comprises a magnetoresistive sensor or a fluxgate sensor.

* * * * *

UNITED STATES PATENT AND TRADEMARK OFFICE
CERTIFICATE OF CORRECTION

| | | |
|---|---|---|
| PATENT NO. | : 8,963,537 B2 | Page 1 of 1 |
| APPLICATION NO. | : 13/483271 | |
| DATED | : February 24, 2015 | |
| INVENTOR(S) | : Racz Robert et al. | |

It is certified that error appears in the above-identified patent and that said Letters Patent is hereby corrected as shown below:

In the Claims:

Claim 10, Column 8, line 29, please add the words "the feet" after "that".

Signed and Sealed this
Twenty-eighth Day of July, 2015

Michelle K. Lee
*Director of the United States Patent and Trademark Office*